(12) United States Patent
Asaka et al.

(10) Patent No.: US 10,199,561 B2
(45) Date of Patent: Feb. 5, 2019

(54) CARBON NANOFIBER ACTUATOR

(71) Applicants: NATIONAL INSTITUTE OF ADVANCED INDUSTRIAL SCIENCE AND TECHNOLOGY, Tokyo (JP); NATIONAL UNIVERSITY CORPORATION GUNMA UNIVERSITY, Maebashi-shi, Gunma (JP); ALPS ELECTRIC CO., LTD., Tokyo (JP)

(72) Inventors: Kinji Asaka, Ikeda (JP); Takushi Sugino, Ikeda (JP); Soshi Shiraishi, Kiryu (JP); Isao Takahashi, Tokyo (JP); Tomomasa Takatsuka, Tokyo (JP); Shinya Komura, Iwakuni (JP)

(73) Assignees: NATIONAL INSTITUTE OF ADVANCED INDUSTRIAL SCIENCE AND TECHNOLOGY, Tokyo (JP); NATIONAL UNIVERSITY CORPORATION GUNMA UNIVERSITY, Gunma (JP); ALPS ELECTRIC CO., LTD., Tokyo (JP)

(*) Notice: Subject to any disclaimer, the term of this patent is extended or adjusted under 35 U.S.C. 154(b) by 499 days.

(21) Appl. No.: 15/076,730

(22) Filed: Mar. 22, 2016

(65) Prior Publication Data
US 2016/0240770 A1     Aug. 18, 2016

Related U.S. Application Data

(62) Division of application No. 13/544,142, filed on Jul. 9, 2012, now Pat. No. 9,966,525.

(30) Foreign Application Priority Data

Jul. 7, 2011  (JP) ................................. 2011-151130

(51) Int. Cl.
*H01L 41/08* (2006.01)
*H01L 41/193* (2006.01)
(Continued)

(52) U.S. Cl.
CPC ............ *H01L 41/193* (2013.01); *B32B 27/08* (2013.01); *B32B 27/20* (2013.01); *B82Y 15/00* (2013.01);
(Continued)

(58) Field of Classification Search
CPC ........ H01L 41/08; H01L 41/193; B32B 27/08
(Continued)

(56) References Cited

U.S. PATENT DOCUMENTS 776,779 A * 12/1904 Hiroshi ................... B41B 11/06
                                                    423/445 R
7,700,064 B2 * 4/2010 Sakurai ..................... D01F 9/14
                                                      423/447.1
(Continued)

FOREIGN PATENT DOCUMENTS

JP      2001-309674 A    11/2001
JP      2005-163229 A     6/2005
(Continued)

OTHER PUBLICATIONS

Notification of Reasons for Refusal dated Feb. 9, 2016, issued in counterpart Japanese Patent Application No. 2012-146580, with English translation. (7 pages).
(Continued)

*Primary Examiner* — Thomas Dougherty
*Assistant Examiner* — Karen B Addison
(74) *Attorney, Agent, or Firm* — Westerman, Hattori, Daniels & Adrian, LLP (57) ABSTRACT

An electroconductive film for an actuator is formed from a gel composition including carbon nanofibers, an ionic liq-
(Continued)

uid, and a polymer. The carbon nanofibers are produced with an aromatic mesophase pitch by melt spinning.

7 Claims, 9 Drawing Sheets

(51) Int. Cl.
  *B82Y 30/00* (2011.01)
  *H01B 1/24* (2006.01)
  *B82Y 15/00* (2011.01)
  *D01D 5/00* (2006.01)
  *D01F 9/145* (2006.01)
  *B32B 27/08* (2006.01)
  *B32B 27/20* (2006.01)
  *H01L 41/29* (2013.01)

(52) U.S. Cl.
  CPC .............. *B82Y 30/00* (2013.01); *D01D 5/00* (2013.01); *D01F 9/145* (2013.01); *H01B 1/24* (2013.01); *H01L 41/29* (2013.01); *B32B 2262/106* (2013.01); *B32B 2307/202* (2013.01); *B32B 2457/00* (2013.01); *B32B 2457/04* (2013.01); *Y10T 428/24994* (2015.04)

(58) Field of Classification Search
  USPC .......................................... 310/311, 300, 328
  See application file for complete search history.

(56) References Cited

U.S. PATENT DOCUMENTS

| | | | |
|---|---|---|---|
| 7,776,779 B2 | 8/2010 | Joo et al. | |
| 8,004,146 B2* | 8/2011 | Asaka | H02N 11/006 310/300 |
| 8,709,972 B2* | 4/2014 | Istvan | H01G 9/058 502/423 |
| 2006/0266981 A1 | 11/2006 | Asaka et al. | |

FOREIGN PATENT DOCUMENTS

| | | |
|---|---|---|
| JP | 2006-288040 A | 10/2006 |
| JP | 4038685 B2 | 1/2008 |

OTHER PUBLICATIONS

Notification of Reasons for Refusal dated Aug. 15, 2016, issued in counterpart Japanese Application No. 2012-146580, with machine translation. (5 pages).

Final Office Action dated Jul. 14, 2016, issued in U.S. Appl. No. 13/544,142 (10 pages).

* cited by examiner

CARBON NANOFIBER ACTUATOR

CROSS-REFERENCE TO RELATED APPLICATION

This application is a divisional of U.S. application Ser. No. 13/544,142 filed on Jul. 9, 2012, which is based upon and claims the benefit of Japanese Patent Application No. 2011-151130, filed on Jul. 7, 2011, the entire contents of which are incorporated herein by reference.

TECHNICAL FIELD

This invention relates to an electroconductive film, an actuator element including an electroconductive film, and a method for producing an actuator element. The actuator element herein refers to one that is driven by an electrochemical process such as an electrochemical reaction or charging/discharging of electrical double layers.

BACKGROUND

Japan Patent No. 4038685 proposes an actuator element operable in air or in vacuo, wherein the actuator uses a gel of carbon nanotubes and an ionic liquid as an active layer that is electroconductive and elastic.

A conventional actuator element using such carbon nanotubes is excellent in that the initial speed of deformation is high. However, it is possible that the displacement is reduced when a voltage is applied for a long time, and that the element gradually deteriorates and the amount of deformation decreases when current is applied repeatedly.

SUMMARY OF THE INVENTION

An object of the present invention is to provide an actuator that has the excellent property of holding a displacement and excellent repetition durability.

The inventors found that an actuator element having the improved property of holding a displacement and improved repetition durability can be obtained by using carbon nanofibers in place of conventional carbon nanotubes.

According to the first aspect of the invention, an electroconductive film for an actuator formed from a gel composition is provided. The gel composition includes carbon nanofibers, an ionic liquid, and a polymer, wherein the carbon nanofibers are produced with an aromatic mesophase pitch by melt spinning.

According to the second aspect of the invention, a laminate is provided. The laminate comprises: an electroconductive film for an actuator formed from a gel composition including carbon nanofibers, an ionic liquid and a polymer, wherein the carbon nanofibers are produced with an aromatic mesophase pitch by melt spinning; and an electrolyte membrane including a polymer and an ionic liquid.

According to the third aspect of the invention, an actuator element is provided. The actuator element comprises: an electrolyte membrane including a polymer and an ionic liquid; and at least two electroconductive films provided in a mutually insulative state on the opposing surfaces of the electrolyte membrane. Each electroconductive film is formed from a gel composition including carbon nanofibers, an ionic liquid, and a polymer. The carbon nanofibers are produced with an aromatic mesophase pitch by melt spinning. The actuator deforms when a potential difference is applied across the electroconductive films.

According to the fourth aspect of the invention, a method for producing an actuator element is provided. The method comprises: preparing a dispersion fluid including carbon nanofibers, an ionic liquid and a polymer, wherein the carbon nanofibers are produced with an aromatic mesophase pitch by melt spinning; preparing a solution including a polymer and an ionic liquid; and forming an electroconductive film using the dispersion fluid and forming an electrolyte membrane using the solution at the same time or sequentially to form a laminate of a layer of the electroconductive film and a layer of the electrolyte membrane.

According to the fifth aspect of the invention, an electroconductive film for an actuator is provided. The electroconductive film comprises: carbon nanofibers; an ionic liquid; and a polymer, wherein the carbon nanofibers are produced with an aromatic mesophase pitch by melt spinning.

According to the sixth aspect of the invention, an actuator element is provided. The actuator element comprises: an ion-conductive layer; and at least two electroconductive films provided in a mutually insulative state on the opposing surfaces of the ion-conductive layer. Each electroconductive film is formed from a gel composition including carbon nanofibers, an ionic liquid, and a polymer. The carbon nanofibers are produced with an aromatic mesophase pitch by melt spinning. The actuator deforms when a potential difference is applied across the electroconductive films.

According to the seventh aspect of the invention, use of a carbon nanofiber for producing an electroconductive film for an actuator is provided. The electroconductive film comprises carbon nanofibers, an ionic liquid, and a polymer. The carbon nanofiber is produced with an aromatic mesophase pitch by melt spinning.

DETAILED DESCRIPTION OF THE PREFERRED EMBODIMENTS

In the present invention, an electroconductive film (electrode layer) of an actuator element includes carbon nanofiber, a polymer, and an ionic liquid. An electrolyte membrane used as an ion-conductive layer includes a polymer and optionally an ionic liquid.

Carbon nanofibers (CNF) for use in the present invention are carbon nanofibers each having a lower limit of diameter of 150 nm and a upper limit of diameter of 500 nm. The lower limit of length of CNF is approximately 10 μm and the upper limit of length of CNF is approximately 100 μm, 200 μm, 300 μm, 400 μm, 500 μm, 600 μm, 700 μm, 800 μm, 900 μm, or 1000 μm.

CNF can be produced with aromatic mesophase pitch as a carbon precursor polymer, dispersing it into a polymer matrix to make a polymer blend, melt-spinning the polymer blend, curing the spun fibers and heating them for carbonization, and activating and graphitizing the carbonized fibers as required. The CNF activated by an activation process is referred to as ACNF (activated CNF). A preferred example of such a CNF is carbon nanofiber manufactured by TEIJIN Limited. Specific conditions for producing CNF (including ACNF) are described in detail in Japanese Laid-open Patent Publication No. 2011-114140 as a method for producing an electrode material comprising micro carbon fiber. It is preferred that CNF be produced in accordance with these production conditions.

As CNF used for an electroconductive film of an actuator element, CNF, a combination of CNF and ACNF, or ACNF may be used. ACNF is preferably used since it has a large electrochemical capacity. For an activation process, known techniques may be used such as gas activation using gas such as water vapor, chemical activation using a chemical such as zinc chloride, and alkali activation using an alkali metal compound.

As long as the electrical properties of the electroconductive film are maintained, the electroconductive film may also include another carbon nanomaterial that is different from CNF.

As used herein, the phrase "no substantial decay of displacement for 8,000 seconds or longer at a certain voltage" means that, when an actuator is operated at a certain voltage such as 2 V or 3 V, the displacement amount gradually increases up to 8,000 seconds or, when the displacement amount records the maximum displacement within 8,000 seconds, the displacement amount is maintained up to 8,000 seconds at the level of 70% or more of the maximum displacement, preferably at the level of 80% or more of the maximum displacement, more preferably at the level of 85% or more of the maximum displacement, even more preferably at the level of 90% or more of the maximum displacement, and especially at the level of 95% or more of the maximum displacement.

Ionic liquids usable in the present invention are salts called room-temperature molten salts or simply molten salts, and they are in a molten state within a broad temperature range including ordinary temperatures (room temperature). For example, the ionic liquids are salts that are in a molten state, for example, at 0° C., preferably at −20° C., and more preferably at −40° C. It is preferred that the ionic liquids used in the present invention have high ion conductivity.

Although a variety of known ionic liquids are usable in the present invention, those that are in a liquid state and stable at and around ordinary temperatures (room temperature) are preferred. Examples of ionic liquids preferably used in the present invention are those containing cations (preferably imidazolium ions or quaternary ammonium ions) represented by Formulas (I) to (IV) below and anions (X⁻)

In Formulas (I) to (IV) above, R is a straight or branch chain $C_1$-$C_{12}$ alkyl group or ether-linkage-containing straight or branch chain alkyl group having a total of 3 to 12 carbon and oxygen atoms. In Formula (I), $R^1$ represents a straight or branch chain $C_1$-$C_4$ alkyl group or a hydrogen atom. In Formula (I), R and $R^1$ are preferably not the same. In Formulas (III) and (IV), each x is an integer from 1 to 4.

Examples of the straight or branch chain $C_1$-$C_{12}$ alkyl group are methyl, ethyl, n-propyl, isopropyl, n-butyl, isobutyl, sec-butyl, t-butyl, pentyl, hexyl, heptyl, octyl, nonyl, decyl, undecyl, and dodecyl. The number of carbons is preferably from 1 to 8, more preferably from 1 to 6.

Examples of the straight or branch chain $C_1$-$C_4$ alkyl group are methyl, ethyl, n-propyl, isopropyl, n-butyl, isobutyl, sec-butyl, and t-butyl.

Examples of the ether-linkage-containing alkyl group having a total of 3 to 12 carbon and oxygen atoms are $CH_2OCH_3$, $(CH_2)_p(OCH_2CH_2)_qOR^2$, wherein p is an integer from 1 to 4, q is an integer from 1 to 4, and $R^2$ is $CH_3$ or $C_2H_5$.

Examples of an anion (X⁻) are tetrafluoroboric acid ion ($BF_4^-$), $BF_3CF_3^-$, $BF_3C_2F_5^-$, $BF_3C_3F_7^-$, $BF_3C_4F_9^-$, hexafluorophosphoric acid ion ($PF_6^-$), bis(trifluoromethanesulfonyl)imidic acid anion (($CF_3SO_2)_2N^-$), perchloric acid ion ($ClO_4^-$), tris(trifluoromethanesulfonyl)carbon acid ion (($CF_3SO_2)_3C^-$), trifluoromethanesulfonic acid ion ($CF_3SO_3^-$), dicyanamide ion (($CN)_2N^-$), trifluoroacetic acid ion ($CF_3COO^-$), organic carboxylic acid ions, and halogen ions.

Among these, specific examples of the ionic liquids are the ones including 1-ethyl-3-methylimidazorium ion or $[N(CH_3)(CH_3)(C_2H_5)(C_2H_4OC_2H_4OCH_3)]^+$ as a cation and a halogen ion or tetrafluoroboric acid ion as an anion. Two or more cations and/or anions may be used to decrease the melting point.

The combinations of a cation and an anion are not limited to the above combinations, and any combination of a cation and an anion may be used as long as the ionic liquid has an electrical conductivity of 0.1 $Sm^{-1}$ or greater.

Examples of polymers usable in the present invention are a copolymer of a hydrogen-containing fluorinated olefin and perfluoro olefin such as polyvinylidene fluoride-hexafluoro propylene [PVDF(HFP)], a homopolymer of a hydrogen-containing fluorinated olefin such as polyvinylidene fluoride (PVDF), perfluorosulfonic acid (Nafion), poly-2-hydroxyethyl methacrylate (poly-HEMA), poly(methyl)acrylate such as polymethyl methacrylate (PMMA), polyethylene oxide (PEO), and polyacrylonitrile (PAN).

In the preferred embodiment of the invention, an electroconductive film used as an electrode layer of the actuator element includes carbon nanofibers, an ionic liquid, and a polymer.

The percentage of each component in the electroconductive film is as follows: carbon nanofibers: 3-90 mass %, preferably 16.6-70 mass %, more preferably 20-50 mass %; ionic liquid: 5-80 mass %, preferably 15-73.4 mass %, more preferably 20-69 mass %; and polymer: 4-70 mass %, preferably 10-68.4 mass %, more preferably 11-64 mass %.

In the preferred embodiment of the invention, an electrolyte membrane used as an ion-conductive layer of the actuator element includes an ionic liquid and a polymer.

The percentage of each component in the electrolyte membrane is as follows:

ionic liquid: 10-90 mass %, preferably 30-80 mass %, more preferably 40-70 mass %; and polymer: 90-10 mass %, preferably 70-20 mass %, more preferably 60-30 mass %.

Figure 2A:
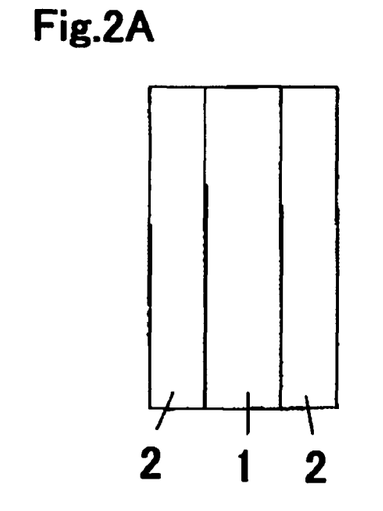
FIG. 2A is a schematic view illustrating the configuration of an example of a 3-layer actuator element of the invention.

The actuator element of the invention has, for example, a 3-layer structure including an electrolyte membrane 1 and electroconductive films (electrode layers) 2 and 2 that sandwich the electrolyte membrane 1 from both sides of the electrolyte membrane 1, wherein each of electroconductive films (electrode layer) 2 and 2 includes carbon nanofibers, an ionic liquid, and a polymer (FIG. 2A).

Figure 2B:
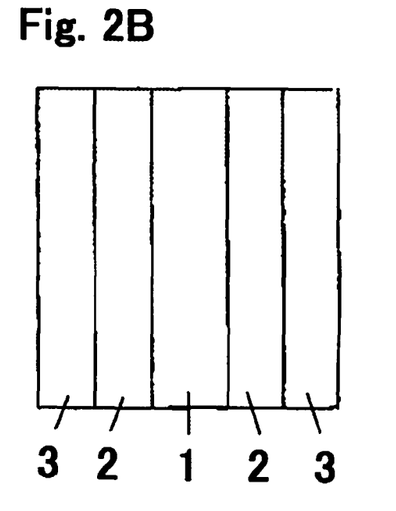
FIG. 2B is a schematic view illustrating the configuration of an example of a 5-layer actuator element of the invention.

The actuator element of the invention may also have a 5-layer structure including additional electroconductive layers 3 and 3 provided outside the electrode layers 2 and 2 to improve surface conductivity of the electrodes (FIG. 2B).

To obtain an actuator element by laminating the electroconductive films on the electrolyte membrane, it is possible to alternately apply by casting a gel solution for an electrode where carbon nanofibers, an ionic liquid, and a polymer are dispersed in a solvent, and a gel solution for an electrolyte including an ionic liquid and a polymer, and then dry and laminate these gel solutions. Alternatively, an electroconductive film that was obtained by casting and drying separately from the electrolyte membrane may be thermally compressed on the electrolyte membrane that was obtained by casting and drying.

In the present invention, uniform mixing of each component is important in preparing the electroconductive film including carbon nanofibers, an ionic liquid, and a polymer To prepare a dispersion fluid in which each component is mixed uniformly, use of a solvent is preferred. The solvent may be a single solvent or a mixture of solvents. For example, a mixed solvent of a hydrophobic solvent and a hydrophilic solvent is particularly preferred.

Examples of the hydrophilic solvent are carbonates such as ethylene carbonate, propylene carbonate, dimethyl carbonate, diethyl carbonate, methyl ethyl carbonate, propylene carbonate, and butylene carbonate; ethers such as tetrahydrofuran; lower alcohols having the carbon number from 1 to 3 such as acetone, methanol and ethanol; and acetonitrile.

Examples of the hydrophobic solvent are ketones having a carbon number from 5 to 10 such as 4-methylpentane-2-on; halogenated hydrocarbons such as chloroform and methylene chloride; aromatic hydrocarbons such as toluene, benzene and xylene; aliphatic or alicyclic hydrocarbons such as hexane and hydrohexane; and N,N-dimethylacetamide.

A dispersion fluid for producing the electroconductive film of the invention may be prepared by mixing an ionic liquid and carbon nanofibers for gelling and then adding a polymer and a solvent to the gel to prepare the dispersion fluid. Regarding the solvent, for example, when the ionic liquid is hydrophilic, the solvent is a mixture of a hydrophilic solvent and a hydrophobic solvent. When the ionic liquid is hydrophobic, the solvent is a hydrophobic solvent. Alternatively, a dispersion fluid may be prepared without a gelling process by adding carbon nanofibers, an ionic liquid, a polymer, and, if necessary, a solvent. Regarding the solvent, for example, when the ionic liquid is hydrophilic, the solvent is a mixture of a hydrophilic solvent and a hydrophobic solvent. When the ionic liquid is hydrophobic, the solvent is a hydrophobic solvent. In this case, dispersion by ultrasonic waves is also effective in mixing components.

When the dispersion fluid is prepared after the gelation, the ratio of mixed solvents, i.e., of hydrophilic solvent to hydrophobic solvent (mass ratio), is preferably from 20:1 to 1:10, more preferably from 2:1 to 1:5.

When the dispersion fluid is prepared without the gelling process, the ratio of the hydrophilic solvent (PC) to the hydrophobic solvent (MP) is preferably from 1:100 to 20:100, more preferably from 3:100 to 15:100. A single solvent may be used. In that case, N,N-dimethylacetamide is preferred.

The electroconductive film of the invention is formed from a polymer gel composition including carbon nanofibers, an ionic liquid, and a polymer.

The mixing ratio (mass ratio) of carbon nanofibers plus ionic liquid to polymer in the electroconductive film is preferably from 1:2 to 4:1, more preferably from 1:1 to 3:1. In mixing, a mixed solvent of the hydrophilic solvent and the hydrophobic solvent may be used. A dispersion fluid for preparing the electroconductive film may be obtained by forming a gel by mixing the carbon nanofibers and the ionic liquid in advance, and adding the polymer and the solvent (preferably, hydrophobic solvent) to the gel. In this case, the ratio of carbon nanofibers plus ionic liquid to polymer is preferably from 1:1 to 3:1.

Although the electroconductive film may include a small amount of the solvent (hydrophobic solvent and/or hydrophilic solvent), it is preferred that a solvent that can be removed in a normal dry condition be removed as much as possible.

The gel composition that forms the ion-conductive layer is composed of a polymer and an ionic liquid. The preferred ion-conductive layer has a mixing ratio (mass ratio) of the hydrophilic ionic liquid to the polymer preferably from 1:4 to 4:1, more preferably from 1:2 to 2:1 in obtaining the gel composition. In the mixing, as described above, a solvent in which a hydrophilic solvent and a hydrophobic solvent are mixed at a given ratio is preferably used.

The ion-conductive layer that serves as a separator for separating two or more electroconductive films may be formed by dissolving the polymer in a solvent and performing a common method such as coating, printing, extrusion, casting, or injection. The ion-conductive layer may be formed substantially from a polymer only or formed by adding an ionic liquid to the polymer.

The polymer used for the electroconductive film and the polymer used for the ion-conductive layer may be the same or different. However, the two polymers are preferably the same or have similar properties to improve adhesive properties between the one or more electroconductive films and the ion-conductive layer.

The thickness of the electrolyte membrane is preferably from 5 µm to 200 µm, more preferably from 10 µm to 100 µm. The thickness of the electroconductive film is preferably from 10 µm to 500 µm, more preferably from 50 µm to 300 µm. For forming each layer, spin coating, printing, spraying, and the like may be used. Extrusion and injection may also be used.

With respect to the actuator element thus obtained, when a DC voltage from 0.5 V to 4 V is applied across the electrodes (the electrodes are electrically connected to the electroconductive films), a displacement of about 0.05 to about 1 time the length of the element can be obtained within a few seconds. Moreover, the actuator element can flexibly function in an atmosphere of an inert gas such as nitrogen, in air including in dry air, and/or in vacuo.

Figure 3A:
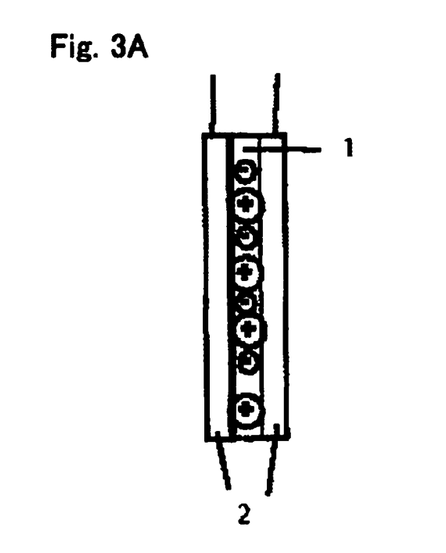
FIGS. 3A and 3B are schematic views illustrating an operating principle of the actuator element of the invention.
Figure 3B:
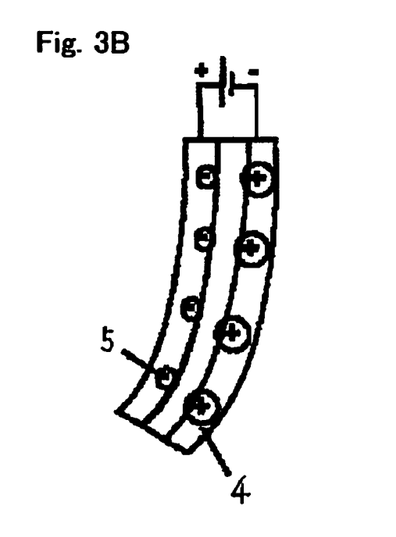

The principle of the operation of the actuator element is illustrated in FIGS. 3A and 3B. When a potential difference is applied across the electroconductive films 2 and 2 that are provided in a mutually insulative state on the opposing surfaces of the electrolyte membrane 1, an electrical double layer is formed at the interface between the carbon nanotube phase and the ionic liquid phase in the electroconductive films 2 and 2, and the electroconductive films 2 and 2 expand or contract according to the interfacial stress created by the electrical double layer. As illustrated in FIG. 3B, the film is flexed in the direction of the positive electrode. This is presumably because carbon nanofibers undergo greater elongation on the negative electrode side due to a quantum chemical effect, and, in currently commonly used ionic liquids, the ion radius of cations 4 is large, resulting in greater elongation on the negative electrode side due to steric effects. In FIG. 3B, "4" indicates a cation of an ionic liquid and "5" indicates an anion of an ionic liquid.

The actuator element obtained according to the method described above can contribute to fields where the property of electrical expansion/contraction of carbon nanofibers can be advantageously used because the effective interfacial area of the gel formed from the carbon nanofibers and the ionic liquid is significantly large, and the impedance at the interfacial electrical double layer is hence small. Moreover, mechanically, adhesion at the interface is enhanced and the durability of the element is increased. As a result, it is possible to obtain an element that exhibits good responsivity in an atmosphere of an inert gas such as nitrogen, in air including in dry air, and/or in vacuo, and that creates large displacement and is durable. Furthermore, the structure of the element is simple, and the element can be easily produced in a small size and can function with little electricity. In addition, by adding a conductive additive to the carbon nanofibers, electrical conductivity and filling rate of the electrode film are improved. Thus, power can be effectively generated compared to similar conventional elements.

The actuator element of the invention can operate repeatedly without decay of displacement at a certain voltage (for example, 2 V or 3 V) for 8,000 seconds or longer, preferably for 8,500 seconds or longer, more preferably for 9,000 seconds or longer, and especially for 10,000 seconds or longer.

Since the actuator element of the present invention flexibly functions in an atmosphere of an inert gas such as nitrogen, in air including in dry air, and/or in vacuo with good durability under low-voltage conditions, it is suitable as an actuator for robots that need to be safe in interactions with humans (for example, as an actuator for personal robots such as home robots, robot pets and amusement robots); robots that work in special environments such as in space, in vacuum chambers, in rescuing, and the like; medical/welfare robots such as surgical elements, muscle suits and bedsore-prevention robots; brakes; micromachines; and the like.

In particular, there is an increasing demand for an actuator for specimen conveyance and positioning in material production environments in vacuo and ultra-clean environments to obtain products with high purity. The actuator element of the invention produced using an ionic liquid that does not evaporate is of use as a contamination-free actuator for processing in environments in vacuo.

Figure 4A:
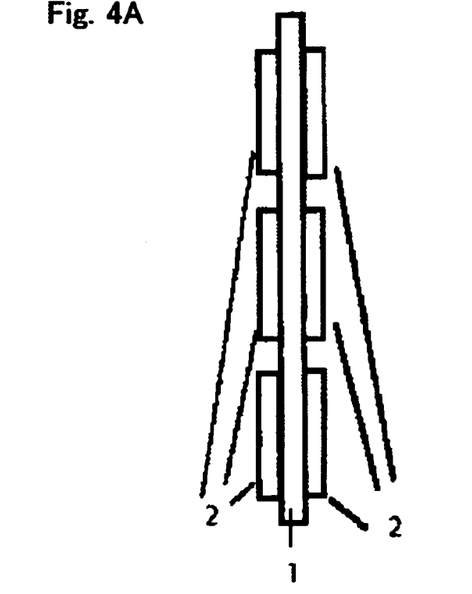
FIGS. 4A and 4B are schematic cross-sectional views illustrating an overview of another example of the actuator element of the invention.
Figure 4B:
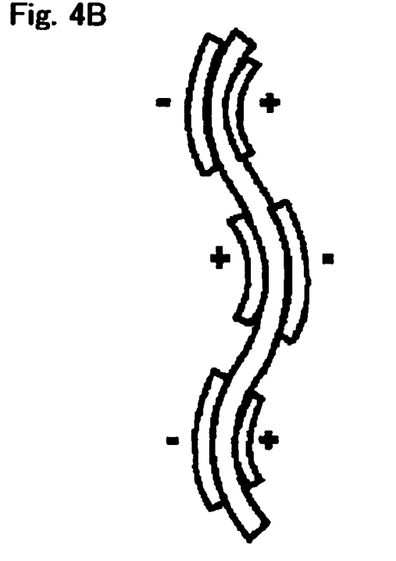

While at least two electroconductive films have to be disposed on the surface of an electrolyte membrane, the disposal of a number of electroconductive films 2 on the surface of planar electrolyte membrane 1 as illustrated in FIGS. 4A and 4B allows an actuator element to perform complex movements. Such an element enables conveyance by peristaltic motion and makes it possible to produce micromanipulators. The shape of the actuator element of the invention is not limited to being planar, and the element can easily be produced in any desired shape. For example, the element illustrated in FIGS. 4A and 4B has four electroconductive films 2 disposed around rod-shaped electrolyte membrane 1 having a diameter of about 1 mm. Such an element allows the production of an actuator that can be inserted into a narrow tube.

The disclosures of all the patents, patent applications, and literature cited in this application are herein incorporated by reference.

EXAMPLES

The present invention will be described in more detail based on the examples. However, it should be understood that the present invention is not limited to these examples.

In these Examples, displacements of actuator elements were evaluated as follows.

Figure 1:
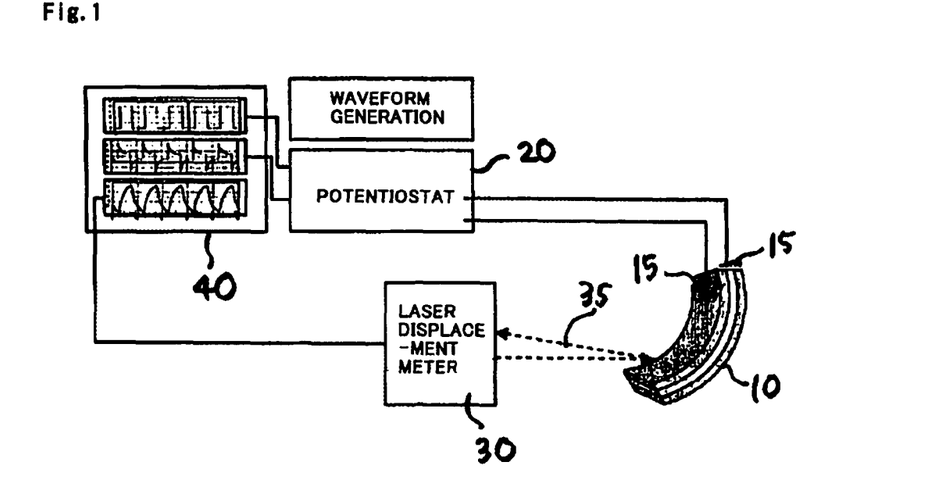
FIG. 1 is a laser displacement meter used for a method for evaluating displacements of actuator elements in the Examples of the invention.

As illustrated in FIG. 1, a 3-layer actuator element 10 was sandwiched between electrodes 15. A potentiostat 20 connected with the electrodes 15 was used to apply a voltage to the actuator element 10. A laser displacement meter 30 was used to measure the displacement of the actuator element 10 based on the detection of the reflected laser 35 from the actuator element 10. The voltage, the current, and the displacement were monitored with an oscilloscope 40 connected to the laser displacement meter 30.

The ionic liquid (IL) used in the Examples is 1-ethyl-3-methyl-imidazorium trifluoromethane sulfonate (EMITFS) (Tokyo Kasei Kogyo Co., Ltd).

Carbon nanofibers(CNFs) used in Examples 1 to 6 were CNFs produced by dispersing an aromatic mesophase pitch into a polymer matrix to make a polymer blend, melt-spinning the polymer blend, curing the spun fibers and heating them for carbonization, and graphitizing the spun fibers, or activated carbon nanofibers (ACNFs) that were the CNFs further activated by alkali activation before the graphitization at 3,000° C. For a method for producing such CNFs and ACNFs, see Japanese Laid-open Patent Publication No. 2011-114140.

In Comparative Example 1, activated VGCF®-X (Showa Denko K. K.) was used. VGCF®-X is a carbon nanotube synthesized by a gas-phase method.

In Comparative Example 2, activated carbon nanofibers that were produced with phenol resin as a carbon precursor polymer and that were produced by melt spinning were used.

The polymer used in the Examples is polyvinylidene fluoride-hexafluoro propylene copolymer [PVDF(HFP); trade name Kynar 2801, Arkema K.K.] as represented by the Formula (III).

(III)

The solvent used in the Examples is N,N-dimethylacetamide (DMAC).

Method for Producing Samples

In these Examples, unless otherwise noted, all the experiments were conducted in a glove box substituted with nitrogen.

1) Preparation of an Electrode Fluid

X1 mg of carbon nanofibers (abbreviated as CNFs hereinafter), X2 mg of activated CNFs (abbreviated as ACNFs hereinafter), Y mg of polymer, i.e., polyvinylidene fluoride-hexafluoro propylene copolymer (PVDF (HFP)) (Kynar 2801, Arkema K.K.), and Z mg of an ionic liquid EMITFS were added to 6.75 mL of solvent (dimethylacetamide (DMAC)). The resultant fluid was ultrasonically dispersed for 2 hours and stirred at 1,000 rpm for one day at room temperature to obtain a viscous electrode fluid.

2) Casting (Formation of Electrode Membranes/Electroconductive Films)

The electrode fluid obtained above was cast in a 2.5 cm×2.5 cm Teflon® mold and the fluid was dried to obtain a self-supported electrode membrane including black CNFs, an electroconductive additive, an ionic liquid, and a base polymer. The thickness was adjusted by the cast amount.

3) Preparation of Electrolyte Liquid 265 mg of EMITFS and 200 mg of PVDF(HFP) were added to a mixing solvent of 2 ml methyl pentanon (MP) and 500 mg of propylene carbonate (PC), and heated and stirred (for 1 day) to obtain a colorless, clear electrolyte liquid.

4) Casting (Formation of Electrolyte Membrane)

The electrolyte liquid was cast in a 2.5 cm×2.5 cm aluminum mold, and the solvent was dried to obtain a semi-transparent, self-supported electrolyte membrane having a thickness from 20 μm to 30 μm.

5) Production of an Actuator Element (3-Layer)

The electrolyte membrane obtained in item 4 above was sandwiched by the two electrode membranes obtained in item 2 above and heated (70° C.) under the pressure (press pressure=270 MPa) to form a 3-layer actuator element. This actuator was cut out into a desired shape, and displacements and developed forces were measured.

Method for Evaluating Samples

In these Examples, unless otherwise noted, all the experiments were conducted in a glove box (GB) substituted with nitrogen.

The amount of deformation of the actuator was measured by measuring the displacement of the actuator. A sample of the actuator was cut out into a strip having a width of 2 mm and length of 10 mm, 5 mm was clipped with gold electrodes, and a voltage was applied. A laser was radiated at a position 4 mm away from the electrodes. Then the displacement was measured by using the laser displacement meter. The voltage and the current at that time were also measured.

Example 1

Figure 5:
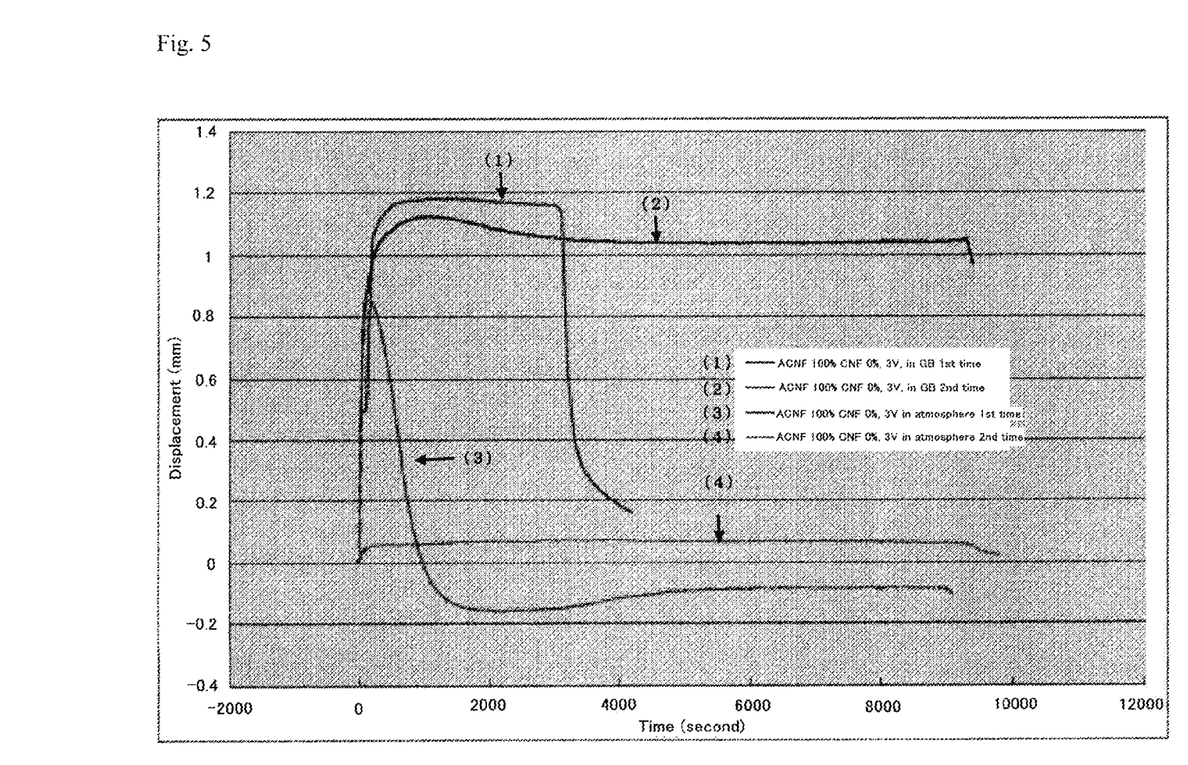
FIG. 5 illustrates a displacement characteristic when 3-V DC (direct-current) voltage was applied to an actuator having an ACNF 100% electrode, and in GB, the displacement is maintained for approximately 10,000 seconds.
Figure 6:
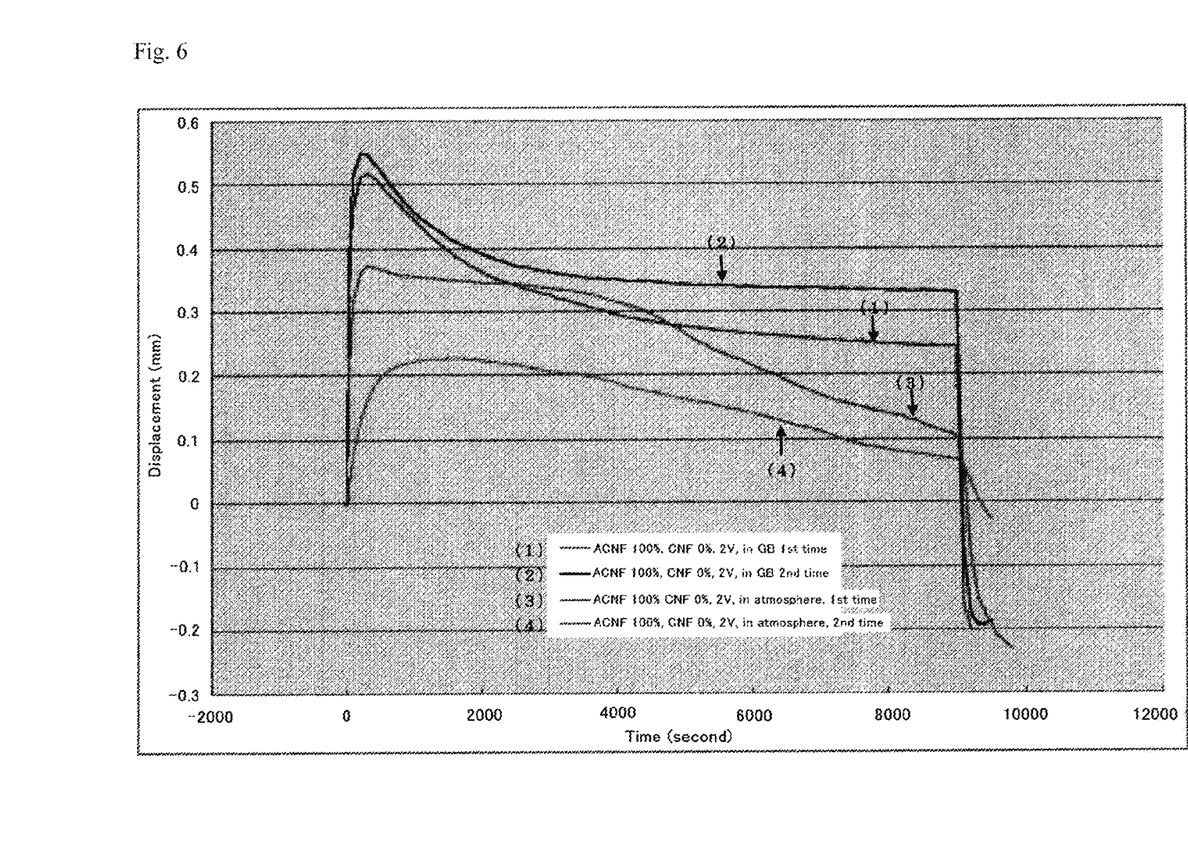
FIG. 6 illustrates a displacement characteristic when 2-V DC voltage was applied to an actuator having an ACNF 100% electrode.

The sample of the actuator was produced under the following conditions: X1=0 mg, X2=37.3 mg, Y=59.9 mg, and Z=175.5 mg. The evaluation results of the displacements are shown in FIGS. 5 and 6. "In atmosphere" indicates that the production and evaluation were conducted in atmosphere, while "in GB" indicates that the production and evaluation were conducted in a glove box.

When the displacement in atmosphere and the displacement in the glove box (GB) are compared, in FIG. 5 (voltage=3 V), there occurs an initial large displacement of about 0.8 mm the first time in atmosphere, but the displacement turns to the reverse direction when the time passes 1,000 seconds. The second time in atmosphere, there is no displacement in the reverse direction, but the displacement amount is as small as 0.1 mm or less. On the other hand, the first time in GB, approximately 1.2 mm of displacement was maintained over the period of 3,000 seconds. The second time in GB, a displacement of 1 mm or more was maintained over the period of 8,000 seconds. This result indicates that it is preferred that the actuator be produced and used in a nitrogen atmosphere such as in GB.

In FIG. 6, where the voltage was changed to 2 V, the displacement amount was smaller than that for 3 V (FIG. 5) and no reverse displacement was observed even when the voltage was applied for a long time. When the displacement pattern of the actuator in atmosphere and that in GB were compared, the displacement amount in GB was far greater. When the voltage was applied only for a short time on the order of several minutes, no reverse displacement occurred, and the actuator operated successfully. However, when the voltage was applied continuously for a long time on the order of ten minutes or longer, the displacement amount was reduced. After continuous operation for more than 2 hours, the second time in atmosphere, the displacement amount of the actuator was greatly reduced. Accordingly, the actuator can be produced and evaluated in atmosphere when the actuator is operated for a short time, but it is desired that the actuator is produced and evaluated in a nitrogen atmosphere when the actuator operates for a long time.

Example 2

Figure 7:
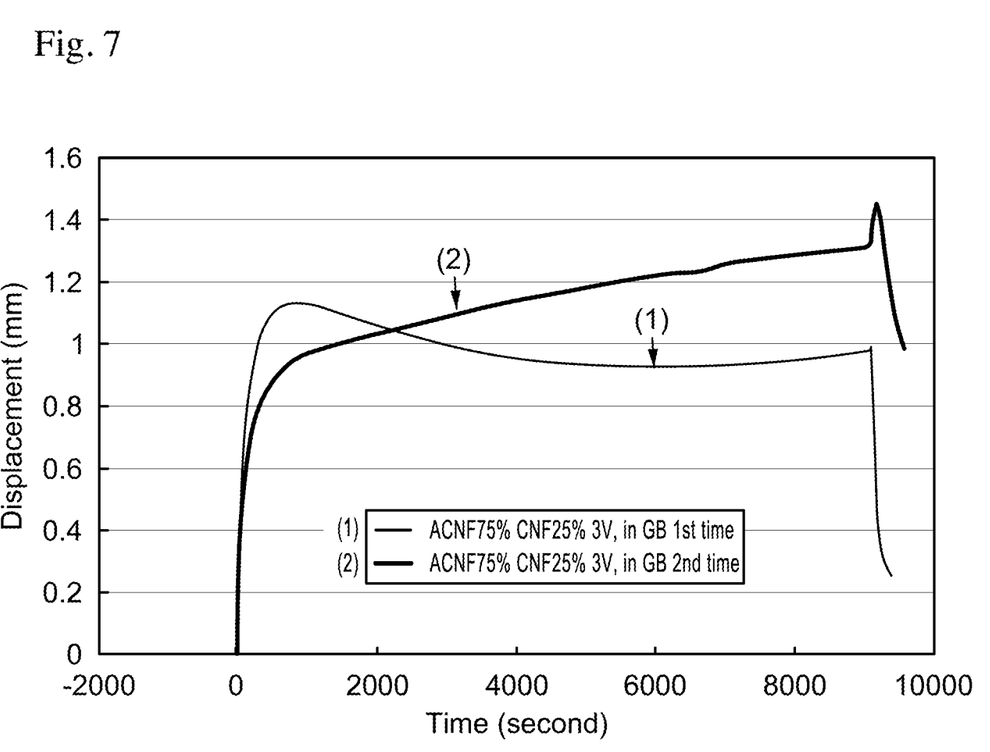
FIG. 7 illustrates a measurement result of displacements of an actuator having an ACNF 75%-CNF 25% electrode (3 V was applied)

The sample of the actuator was produced under the following conditions: X1=8.9 mg, X2=30.7 mg, Y=60 mg, and Z=187.4 mg. The evaluation results of the displacements are shown in FIG. 7. It was revealed that both the first time and the second time in GB, the displacement amounts were greater, and the displacement amounts were maintained for over 8,000 seconds.

Example 3

Figure 8:
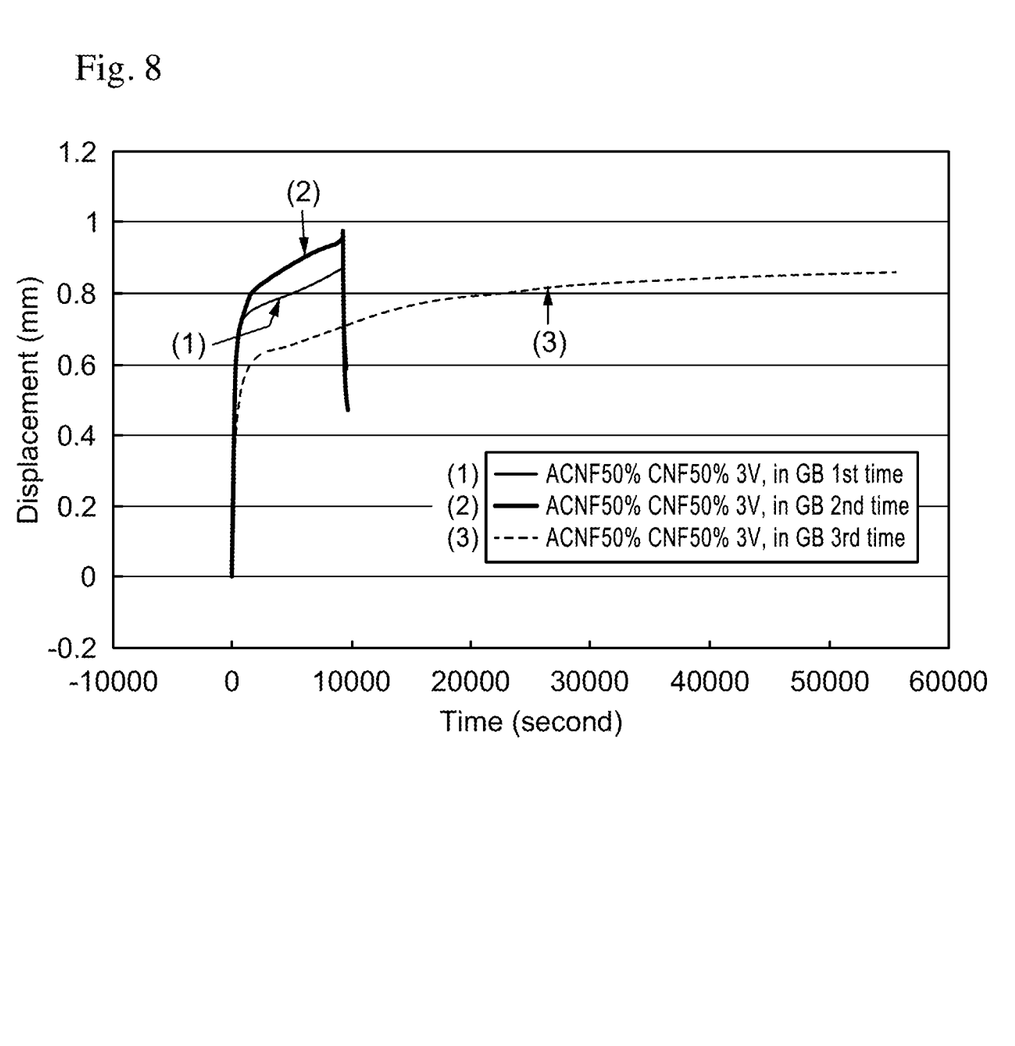
FIG. 8 illustrates a measurement result of displacements of an actuator having an ACNF 50%-CNF 50% electrode (3 V was applied)

The sample of the actuator was produced under the following conditions: X1=18.7 mg, X2=18.4 mg, Y=59.8 mg, and Z=176.8 mg. The evaluation results of the displacements are shown in FIG. 8. In the first, second, and third rounds in GB, the displacement amounts increased from the start to approximately 10,000 seconds. The displacement in the reverse direction was completely inhibited.

Example 4

Figure 9:
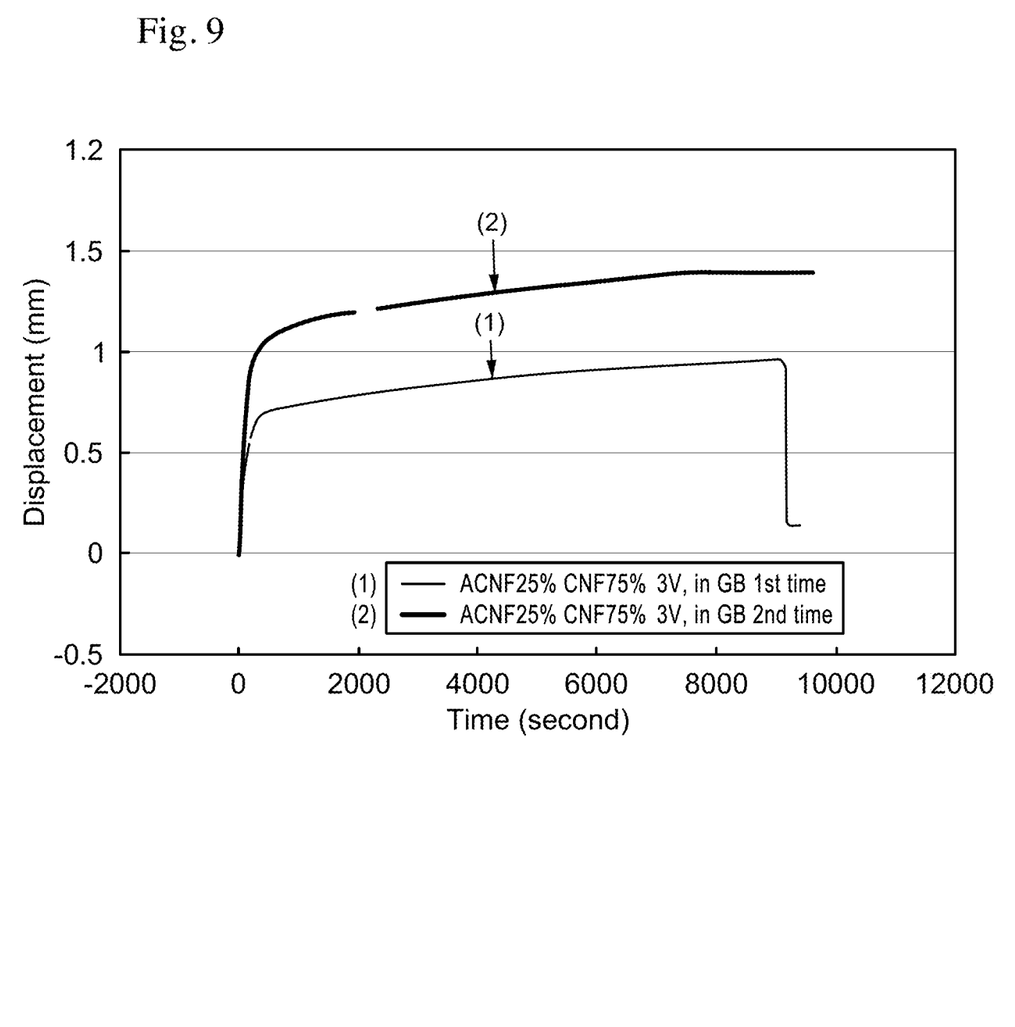
FIG. 9 illustrates a measurement result of displacements of an actuator having an ACNF 25%-CNF 75% electrode (3 V was applied)

The sample of the actuator was produced under the following conditions: X1=28.2 mg, X2=9.1 mg, Y=59.8 mg, and Z=179 mg. The evaluation results of the displacements are shown in FIG. 9. In the first and rounds in GB, the displacement amounts moderately increased from the start over the period of 8,000 seconds. The displacement in the reverse direction was completely inhibited at the voltage condition of 3 V.

Example 5

Figure 10:
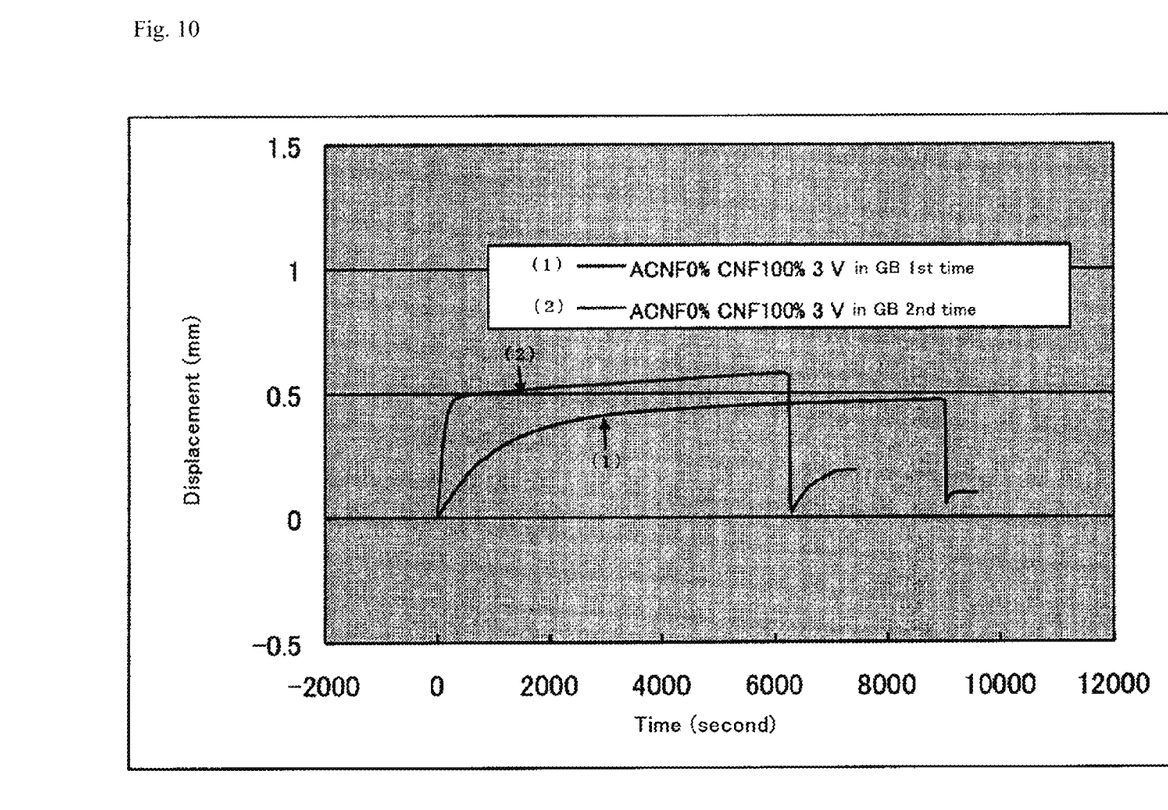
FIG. 10 illustrates a measurement result of displacements of an actuator having aCNF 100% electrode (3 V was applied)

The sample of the actuator was produced under the following conditions: X1=38.6 mg, X2=0 mg, Y=59.8 mg, and Z=174.9 mg. The evaluation results of the displacements are shown in FIG. 10. The displacement was maintained for over the period of 8,000 seconds the first time in GB and for over the period of 6,000 seconds the second time in GB. The displacement in the reverse direction was completely inhibited.

Example 6

Figure 11:
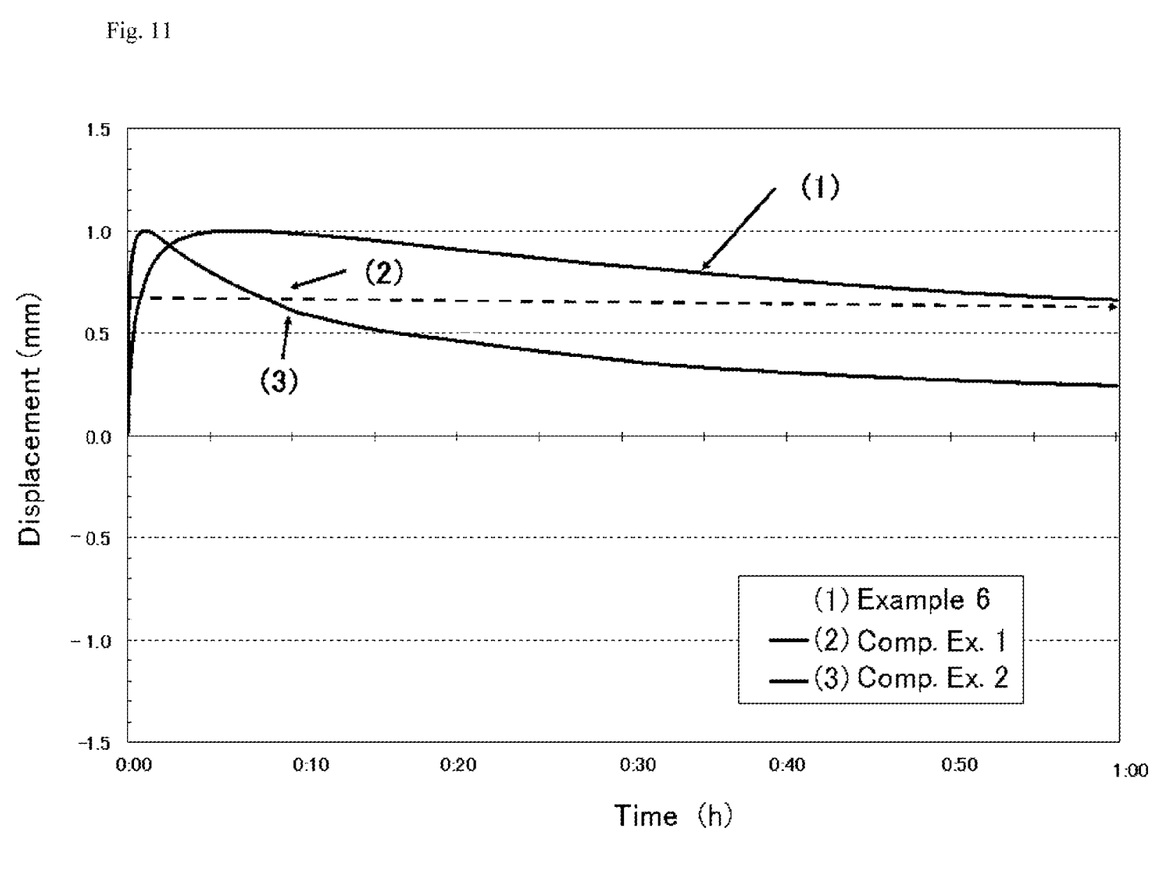
FIG. 11 illustrates a measurement result of a displacement of an electrode actuator of the Examples and displacements of electrode actuators of the Comparative Examples (2 V was applied). The longitudinal axis is a value of the displacement of the actuator sample normalized by the maximum displacement.

The sample of the actuator was produced under the following conditions: X1=0 mg (instead, another carbon nanomaterial: 35 mg), X2=15 mg, Y=35 mg, and Z=85 mg. The evaluation result of the displacement is shown in FIG. 11 (voltage was 2 V). ACNF was prepared by using an aromatic mesophase pitch by melt spinning. In this example, an actuator specimen was displaced in a simple dry environment, which is a environment where a measuring system is placed in an acrylic case and dry air is circulated through. The dew point was set to be −20° C. The displacement ratio reached the maximum ratio of 1.0 and was maintained at a value higher than 0.7 mm for over one hour. This result shows that carbon nanofibers produced with aromatic mesophase pitch by melt spinning are suitable as a material of an actuator.

Comparative Example 1

The sample of the actuator was produced under the following conditions: X1=0 mg (instead, 28 mg of another carbon nanomaterial that is the same as the carbon nanomaterial in Example 6), X2=0 mg (instead, 28 mg of activated VGCF-X), Y=40 mg, and Z=95 mg. The evaluation result of the displacement is shown in FIG. 11 (voltage was 2 V). In this example, after the sample strip of the actuator was displaced, the displacement was reduced as the time passed.

Comparative Example 2

The sample of the actuator was produced under the following conditions: X1=0 mg (instead, 40 mg of the another carbon nanomaterial that is the same as the carbon nanomaterial in Example 6), X2=17 mg, Y=40 mg, and Z=95 mg. The evaluation result of the displacement is shown in FIG. 11 (voltage was 2 V). In this example, after the sample strip of the actuator was displaced, the displacement was reduced as the time passed.

What is claimed is:

1. An actuator element comprising:
an electrolyte membrane including a polymer and an ionic liquid; and
at least two electroconductive films provided in a mutually insulative state on the opposing surfaces of the electrolyte membrane, wherein each electroconductive film is formed from a gel composition including carbon nanofibers, an ionic liquid, and a polymer, wherein the carbon nanofibers comprise a melt spun aromatic mesophase pitch, wherein the carbon nanofibers comprise activated carbon nanofibers,
wherein the actuator deforms when a potential difference is applied across the electroconductive films.

2. The actuator element according to claim 1, wherein the actuator can operate repeatedly with no substantial decay of displacement for 8,000 seconds or longer at a certain voltage.

3. The actuator element according to claim 1, further comprising an ion-conductive layer, wherein the at least two electroconductive films provided in a mutually insulative state on the opposing surfaces of the ion-conductive layer.

4. An actuator element comprising:
an electrolyte membrane including a polymer and an ionic liquid; and
at least two electroconductive films provided in a mutually insulative state on the opposing surfaces of the electrolyte membrane, wherein each electroconductive film is formed from a gel composition including carbon nanofibers, an ionic liquid, and a polymer, wherein the carbon nanofibers comprise a melt spun aromatic mesophase pitch,
wherein
the actuator deforms when a potential difference is applied across the electroconductive films, and
the actuator can operate repeatedly with no substantial decay of displacement for 8,000 seconds or longer at a certain voltage.

5. The electroconductive film for an actuator according to claim 4, wherein the carbon nanofibers are selected from the group consisting of carbon nanofibers, activated carbon nanofibers, and
a combination thereof.

6. The electroconductive film for an actuator according to claim 4, wherein the carbon nanofibers comprise activated carbon nanofibers.

7. The actuator element according to claim 4, further comprising an ion-conductive layer, wherein the at least two electroconductive films provided in a mutually insulative state on the opposing surfaces of the ion-conductive layer.

* * * * *